United States Patent [19]

Harada

[11] Patent Number: 4,956,642
[45] Date of Patent: Sep. 11, 1990

[54] SUPERCONDUCTING ANALOG TO DIGITAL CONVERTER

[75] Inventor: Yutaka Harada, Tokyo, Japan

[73] Assignee: Research Development Corporation of Japan, Tokyo, Japan; a part interest

[21] Appl. No.: 274,493

[22] Filed: Nov. 22, 1988

[30] Foreign Application Priority Data

Nov. 24, 1987 [JP] Japan .............................. 62-295780

[51] Int. Cl.[5] ............................................. H03K 13/02
[52] U.S. Cl. ..................................... 341/133; 341/171; 307/306
[58] Field of Search ................. 341/133, 171; 307/306, 307/350; 365/162

[56] References Cited

U.S. PATENT DOCUMENTS

| 2,949,602 | 8/1960 | Crowe | 341/171 |
| 4,315,255 | 2/1982 | Harris et al. | 341/171 |
| 4,551,704 | 11/1985 | Anderson | 341/133 X |
| 4,623,804 | 11/1986 | Goto | 307/306 X |
| 4,785,426 | 11/1988 | Harada et al. | 307/306 X |

Primary Examiner—William M. Shoop, Jr.
Assistant Examiner—Sharon D. Logan
Attorney, Agent, or Firm—Fleit, Jacobson, Cohn, Price, Holman & Stern

[57] ABSTRACT

A superconducting analog to digital converter comprises a plurality of comparators, each of which includes a quantum flux parametron having a superconducting loop with two Josephson devices and exciting inductors, a first load inductor connected to the superconducting loop, and means for supplying exciting current to inductors inductively coupled with said exciting inductors and an rf-SQUID comprising a superconducting loop with a second load inductor and a Josephson device, whereby an input signal is converted to a positive or negative signal by the rf-SQUID for each unit change of the input signal by the amount of the magnetic flux quantum and then the converted signal is sampled and amplified by the quantum flux parametron.

10 Claims, 7 Drawing Sheets

SUPERCONDUCTING ANALOG TO DIGITAL CONVERTER

FIELD OF THE INVENTION

This invention relates to superconducting switching circuits which operate at very low temperatures and particularly relates to analog to digital converters using a quantum flux parametron which is a parametron-type switching circuit involving Josephson devices.

DESCRIPTION OF THE PRIOR ART

The quantum flux parametron is a parametron-type superconducting switching circuit which uses Josephson devices exhibiting the Josephson effects. In the quantum flux parametron, a dc magnetic flux quantum is used as a signal medium and the operation is based on a new concept. The quantum flux parametron is extremely adequate for computer elements because the quantum flux parametron operates at a very high speed, consuming less power. The quantum flux parametron also has very good qualities as analog circuits such as magnetic flux sensors because the quantum flux parametron can amplify very weak magnetic flux in a high gain. The basic operation of the quantum flux parametron is disclosed in U.S. application Ser. No. 146,160, filed on Jan. 20, 1988.

On the other hand, an analog to digital converter using the Josephson devices has been already realized. For example, in C. A. Hamilton et al. "Superconducting A/D Converter Using Latching Comparators" IEEE Trans. Magn., Vol. MAG-21, No. 2, pp. 197–199, March 1985 there is disclosed an analog to digital converter comprising quantum interference circuits using the Josephson devices. This analog to digital converter operates more than ten times faster than semiconductor conventional converters. The prior art circuit using the Josephson devices utilizes latching operation of the Josephson devices. The critical current of the Josephson device can be controlled by flowing a control current near the Josephson device. Therefore, the Josephson device can be easily transmitted from a superconducting state to a voltage state by applying the control current to the Josephson device. However, the Josephson devices do not cause transition from the voltage to the superconducting state only by removing the control current. Thus, in the conventional Josephson devices, a special procedure should be used to cause the Josephson device to do transition from the voltage state to the superconducting state. The latching operation comprises a step of cutting the Josephson device off from a power supply to reverse the voltage stage of the Josephson device to the superconducting state.

In order to operate the analog to digital converter at a high speed, a high frequency alternating current power supply is needed. But, the latching operation restricts the performance of the analog to digital converter as described below.

(1) In order to prevent input data from varying during sampling, very narrow width pulses should be supplied from the high frequency alternating current power supply.

(2) Acceptable region of voltage or current of the alternating current power supply is very narrow to keep the Josephson device in a predetermined biassed condition. Consequently, overshooting of the waveform of the high frequency alternating current power supply should be severely restricted.

In order to be released from these restrictions, several improvements have been atemptted. For example, in D. A. Petersen et al. "A High Speed Analog-to-Digital Converter Using Josephson Self-Gate-AND Comparators" IEEE Trans. Magn., Vol. MAG-21, No. 2 pp. 200–203, March 1985, there has been provided a comparator for sampling input data on rising edges of clock pulses from the power supply. This comparator is called a self-gate-and (SGA) circuit and it is effective to avoid the above restriction (1). However, the circuit arrangement is complicated and the operational margin of the circuit is narrow. Further, this compartor is not effective for the above restriction (2). The quantum flux parametron is a switching circuit without causing the latching operation since the voltage state is not used as one of the switching states. In the quantum flux parametron, input signals are sampled on rising edges of exciting current. The above restrictions are therefore easily removed. However, a high-speed analog to digital converter using the quantum flux parametrons has not been proposed.

SUMMARY OF THE INVENTION

An object of this invention is to realize a very high speed analog to digital converter with a wide margin for the power supply variance, without using very narrow sampling pulses.

In order to attain the object, this invention provides an A/D converter using comparators each of which comprises an rf-SQUID and a quantum flux parametron connected therewith.

In this construction, the rf-SQUID converts an input signal into a positive or negative signal for unit change in the input signal by the amount of the magnetic flux quantum ($2.07 \times 10^{-15}$ Wb), and then the quantum flux parametron samples and amplifies the converted signal on the rising edge of the exciting current.

BRIEF DESCRIPTION OF THE DRAWINGS

Embodiments of this invention will now be described by way of example with reference to the accompanying drawings in which.

DETAILED DESCRIPTION OF THE PREFERRED EMBODIMENTS

Figure 2A:
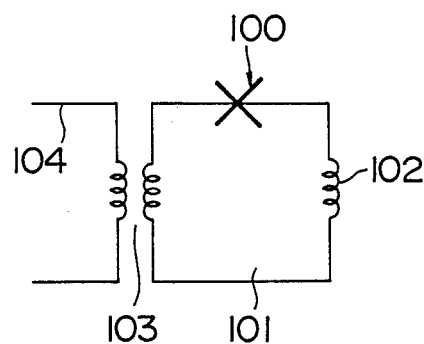
FIG. 2A is a circuit diagram of an embodiment of an rf-SQUID used in this invention.

FIG. 2A shows an example of an rf-SQUID which is used in this invention. This rf-SQUID has a superconducting loop 101 which is formed by a Josephson device 100, a load inductor 102 and a second winding of an input transformer 103. A first winding of the input transformer 103 is connected to an input line 104. Magnetic flux, which is generated by current flow through the input line 104, passes through the superconducting loop 101. Circulating current Ic flowing through the superconducting loop 101 satisfies the quantization condition of fluxoids and obeys the following Eq. (1).

$$2\pi \times Ls \times Im \times \sin \theta/\Phi_0 + \theta + 2\pi \times \Phi_{ex}/\Phi_0 = 2n\pi \quad (1)$$

$$Ic = Im \times \sin \theta$$

where $\Phi_0$ is the magnetic flux quantum ($2.07 \times 10^{-15}$ Wb), Ls is a total inductance of the load inductor and the input inductor, Im is a critical current of the Josephson device 100, $\theta$ is an electron wave phase of the Josephson device 100 and $\Phi_{ex}$ is an input magnetic flux which is generated by the input current and passes through the superconducting loop.

Figure 2B:
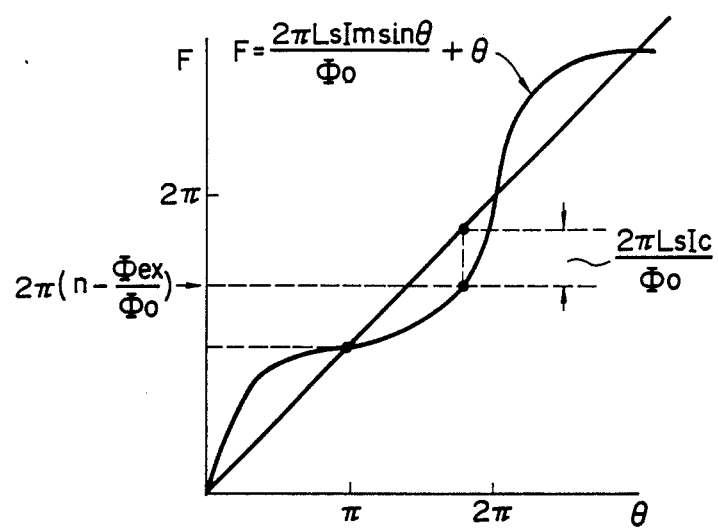
FIG. 2B is a graph representing hysteresis of the rf-SQUID shown in FIG. 2A.

If $Im < \Phi_0/(2\pi Ls)$, a partial sum of Eq. (1) $F = 2\pi \times Ls \times Im \times \sin \theta/\Phi_0 + \theta$ does not have hysteresis as a function of $\theta$. Therefore, as shown in FIG. 2B, solutions of Eq. (1) behave in such a way that the direction of the circulating current Ic is inverted to show a positive or negative signal for each unit change in the input signal by the amount of the magnetic flux quantum $\Phi_0$.

Figure 1:
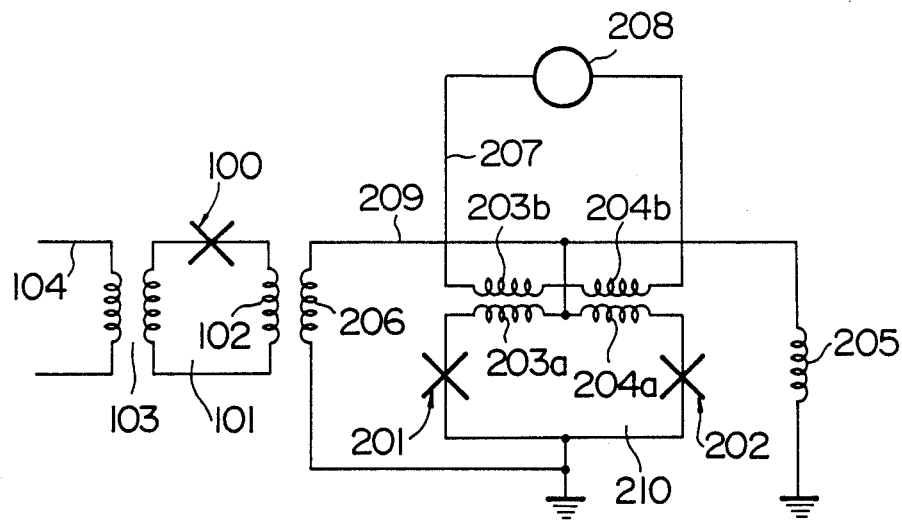
FIG. 1 is a circuit diagram of an embodiment of a comparator according to this invention.

FIG. 1 shows an embodiment of a comparator according to this invention. In the embodiment shown in FIG. 1, the circulating current Ic flowing through the load inductor 102 of the rf-SQUID of FIG. 2A is picked up by a sense inductor 206 which is inductively coupled with the load inductor 102. The signal picked up by the sense inductor 206 is introduced into the quantum flux parametron as an input signal. The quantum magnetic flux parametron has a superconducting loop 210 including two Josephson devices 201 and 202 and superconducting exciting inductors 203a and 204a. A superconducting load inductor 205 is connected to the superconducting loop 210. Inductors 203b and 204b are inductively coupled with the superconducting inductors 203a and 204a. An exciting current supply 208 generates exciting current which flows through an exciting line 207 and produces magnetic flux. The magnetic flux passes through the superconducting loop 210 via inductive coupling between the inductors 203b and 204b and the superconducting inductors 203a and 204a, and then the magnetic flux excites the quantum flux parametron. Message of the input signal for the quantum flux parametron is represented by the direction of the input signal current and the input signal is sampled on the leading edge of the exciting current. Therefore, the circuit of FIG. 1 constructs a comparator in which an input signal is converted to a positive or negative signal by the rf-SQUID for each unit change in the input signal by the amount of the magnetic flux quantum, and the converted signal is sampled on the leading edge of the exciting current and then amplified by the quantum flux parametron.

Figure 3:
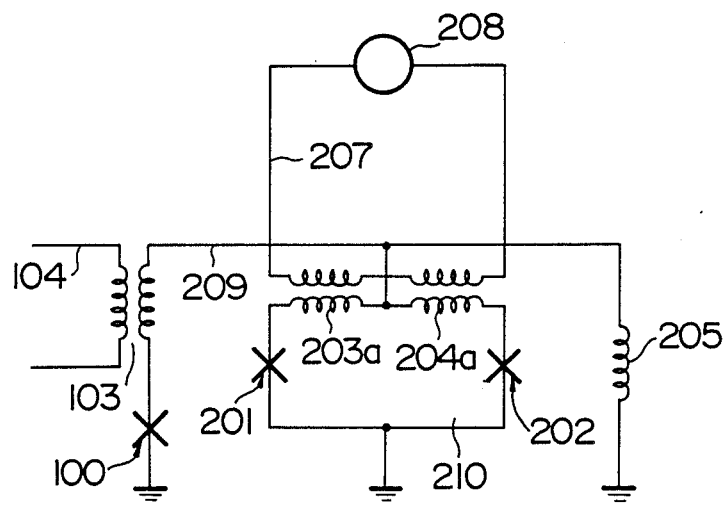
FIG. 3 is a circuit diagram of another embodiment of a comparator according to this invention.

FIG. 3 shows another comparator circuit according to this invention. In this circuit, a series connection of the Josephson device 100 and a second winding of the input transformer 103 is directly connected to the quantum flux parametron. An rf-SQUID is constructed with the Josephson device 100, the input transformer 103 and the quantum flux parametron. In operation, an input signal, which is inputted through the input line 104, is converted into a positive or negative signal by the rf-SQUID. Next, the converted signal is sampled and amplified by the quantum flux parametron.

Figure 8:
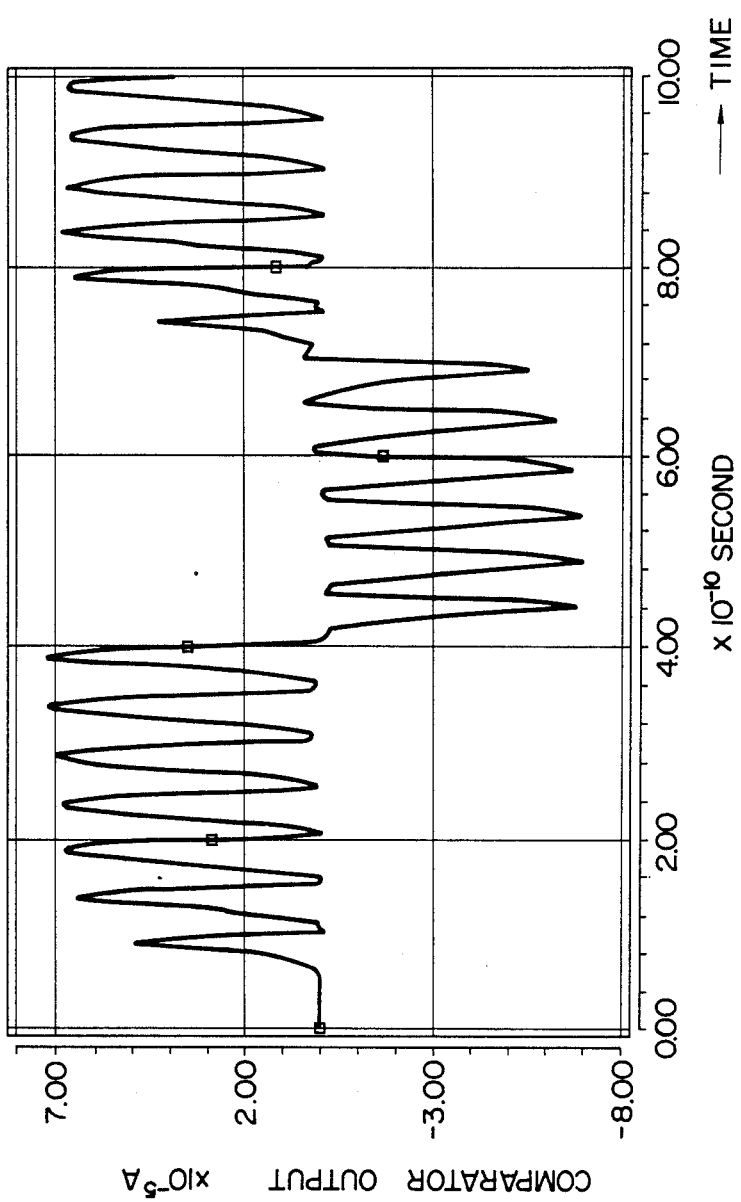
FIG. 8 is a graph representing operation characteristics of a comparator according to this invention.

FIG. 8 shows a result of a circuit simulation which is carried out by a computer to investigate an operation of a comparator according to this invention. In this result, input signal current is increased from zero at a constant rate, and the input signal is sampled and amplified by exciting the quantum flux parametron with a sinusoidal wave of 20 GHz. It is confirmed that the predetermined operation is taken place, that is, an output signal is changed for each unit change in the input signal by the amount of the magnetic flux quantum.

Figure 4:
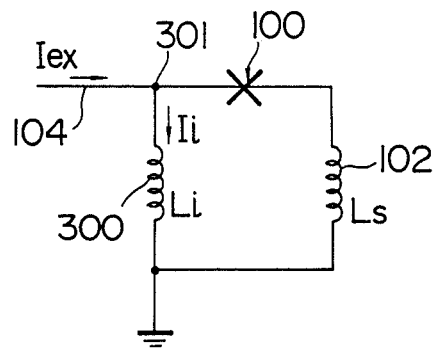
FIG. 4 is a circuit diagram of another embodiment of an rf-SQUID used in this invention.

FIG. 4 shows another rf-SQUID used in an analog to digital converter according to this invention. In the rf-SQUID shown in FIG. 4, an input signal is directly supplied to the rf-SQUID not through an input transformer as shown in FIG. 2A. In the circuit of FIG. 4, an input inductor 300 is connected in parallel with a serial connection of the Josephson device 100 and the load inductor 102. An input signal is directly injected on the connection point 301 through an input line 104. The circuit shown in FIG. 4 obeys Eq. (2) which is obtained from the quantization condition of fluxoids.

$$2\pi \times Ls \times Im \times \sin \theta/\Phi_0 + \theta - 2\pi \times Li \times Ii/\Phi_0 = 2n\pi \quad (2)$$

$$Ii \times Im \times \sin \theta = Iex$$

where $\theta$ is an electron wave phase of the Josephson device 100, Im is a critical current of the Josephson device, Ls is an inductance of the load inductor 102, Li is an inductance of the input inductor 300, Ii is a current flowing through the input inductor 300 and Iex is an input signal current.

By modifing Eq. (2) we will obtain Eq. (3).

$$2\pi \times (Ls+Li) \times Im \times \sin \theta/\Phi_0 + \theta$$
$$-2\pi \times Li \times Iex/\Phi_0 = 2n\pi \quad (3)$$

Eq. (3) has the same form as Eq. (1). Particularly, the form of the current which flows through the Josephson device is the same as that of the circulating current in FIG. 2A. Therefore, concerning the current flowing through the Josephson device 100 or the load inductor 102, the circuit shown in FIG. 4 operates in the same way as in the rf-SQUID of FIG. 2A.

Figure 5:
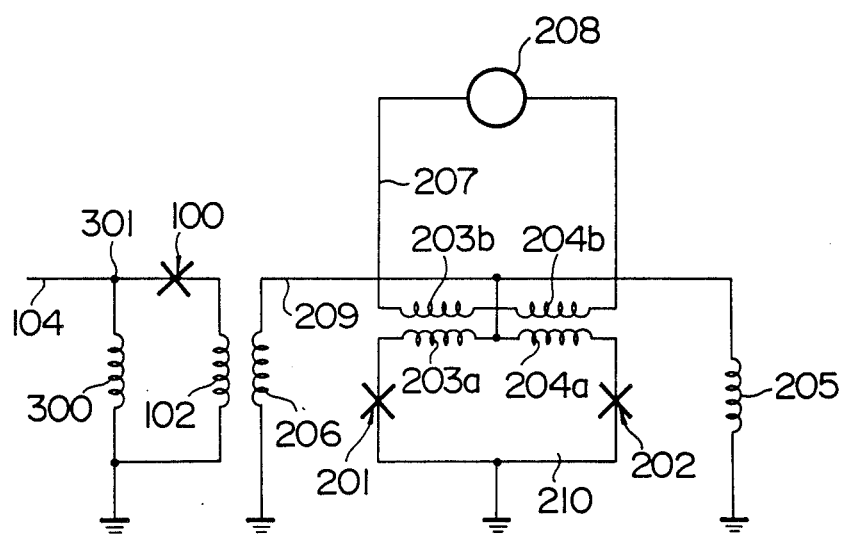
FIG. 5 is a circuit diagram of a comparator using the rf-SQUID shown in FIG. 4.

FIG. 5 shows another embodiment of a comparator used in an analog to digital converter according to this invention. In the circuit shown in FIG. 5, the rf-SQUID shown in FIG. 4 is connected with the quantum flux parametron through the inductive coupling between the load inductor 102 and the sense inductor 206. The rf-SQUID converts an input signal into a positive or negative signal for each unit change in the input signal by the amount of the magnetic flux quantum.

Figure 6:
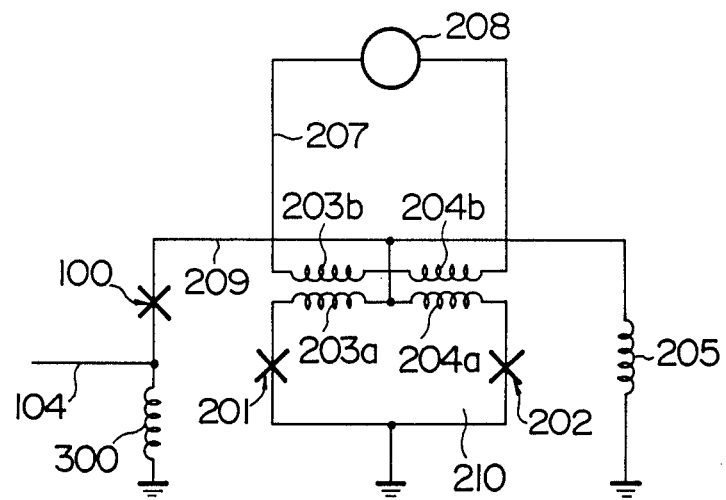
FIG. 6 is a circuit diagram of another comparator using the rf-SQUID of FIG. 4.

FIG. 6 shows another embodiment of a comparator using the rf-SQUID of FIG. 4. In the circuit shown in FIG. 6, the quantum flux parametron corresponds to the load inductor 102 in FIG. 4. An input signal is directly injected through the line 104 connected between the input inductor 300 and the Josephson device 100. The current, which flows through the Josephson device 100 of the rf-SQUID, is directly injected into the quantum flux parametron. This comparator operates in the same way as in the comparator of FIG. 1.

Figure 7:
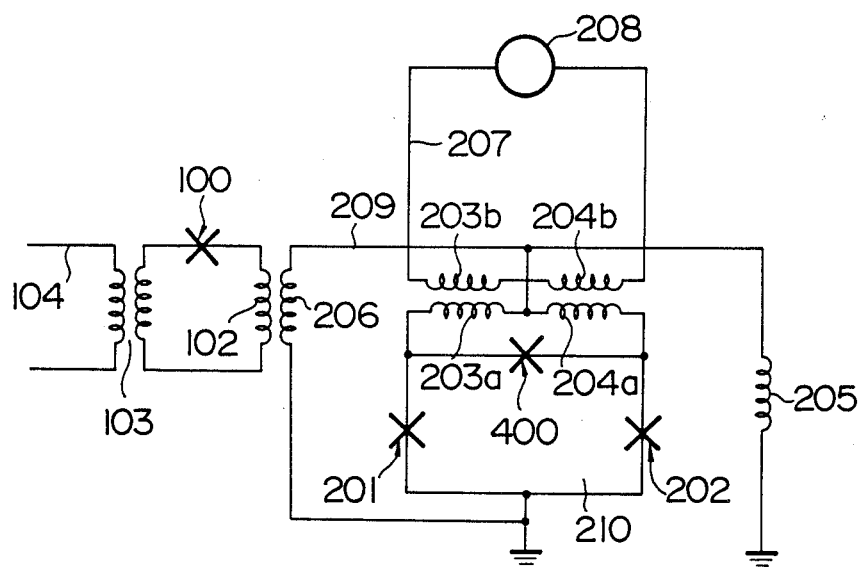
FIG. 7 is a circuit diagram of another comparator obtained by modifing the comparator of FIG. 1, in which a Josephson device is provided to form a magnetic flux parametron.

FIG. 7 shows a construction of a comparator according to this invention, in which sampling characteristic of the quantum flux parametron is improved. In the circuit of FIG. 7, a Josephson device 400 is connected in parallel with the superconducting devices 203a and 204a to form a magnetic flux regulator. The operational priciple of this magnetic flux regurator is disclosed in U.S. application entitled "SUPERCONDUCTING CIRCUIT" filed on Sept. 9, 1988 by E. Goto and Y. Harada. In this construction, if product of a critical current of the Josephson device and an inductance of the superconducting inductor 203a, 204a is increased, hysteresis appears in the characteristic of the magnetic flux regulator. By using this hysteresis, the quantum flux parametron can cause transition from the unexcited state to the excited state within a very short time, so that the sampling time can be extremely shortened.

In order to construct an analog to digital converter by use of a comparator according to this invention, we can use a method of sequentially dividing input current in half by using a ladder type resistor network which is disclosed in D. A. Petersen et al. "A High-Speed Analog-to-Digital Converters Using Josephson Self-Gate-AND Comparators" IEEE Trans. Magn., Vol. MAG-21, No. 2, pp. 200-203, March 1985, or a method of varying coupling strength of input transformers which is disclosed in C. A. Hamilton et al. "Superconducting A/D Converter Using Latching Comparators" IEEE Trans. Magn., Vol. MAG-21, No. 2, pp. 197-199, March 1985.

Figure 9:
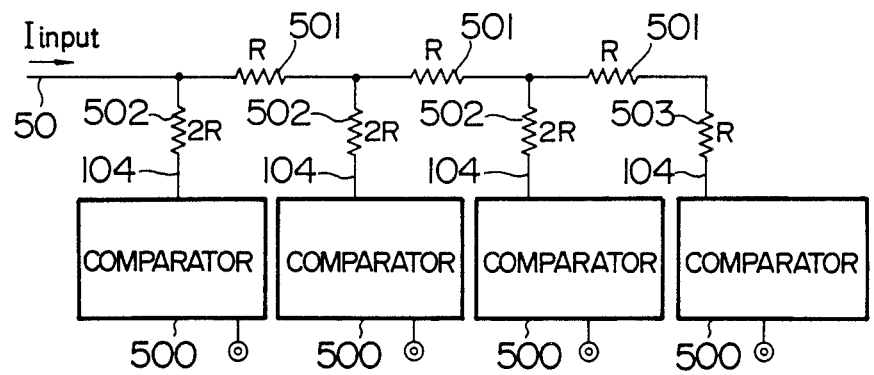
FIG. 9 is a circuit diagram of a 4-bit analog to digital convertor according to this invention.
Figure 10:
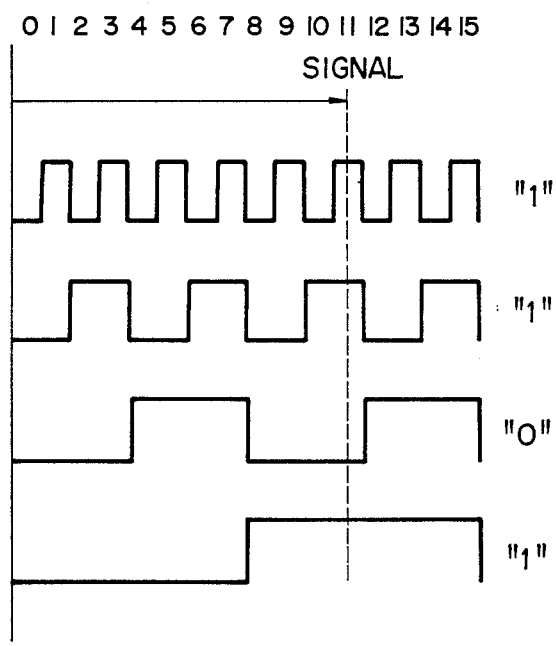
FIG. 10 is a graph for explaining a method of analog to digital conversion and FIG. 11 is a circuit diagram of another 4-bit analog to digital converter according to this invention.

FIG. 9 shows an embodiment of an analog to digital converter using a ladder type circuit. The ladder circuit is constructed by connecting serial resistors 501 and parallel resistors 502, alternatively and terminating at a resistor 503. The resistance value of the parallel resistors 502 is twice as large as that of the serial resistors and the terminating resistor. In this circuit construction, the current flowing through each parallel resistor 502 is divided in half, iteratively. The comparator according to this invention is connected to each parallel resistor 502 and the current flowing through each parallel ragistor is converted to a positive or negative signal for each unit change in the input signal by the amount of the magnetic flux quantum and then amplified. The operating principle of analog to digital conversion in this circuit construction will be explained with reference to FIG. 10. In order to convert an analog signal to a digital signal, templates such as shown in FIG. 10 are prepared. The number of the templates is the same as that of conversion bits. The cycles of successive templates differ by a factor of 2. In operation, it is determined where the input signal is placed on the templates. In the example of FIG. 10, when an input signal is (11) an output signal is (1011). In the circuit of FIG. 9, instead of using different kinds of templates whose cycles are different by twice, the input signal current $I_{input}$ is divided into halves iteratively and conversion is carried out by only one kind of template.

Figure 11:
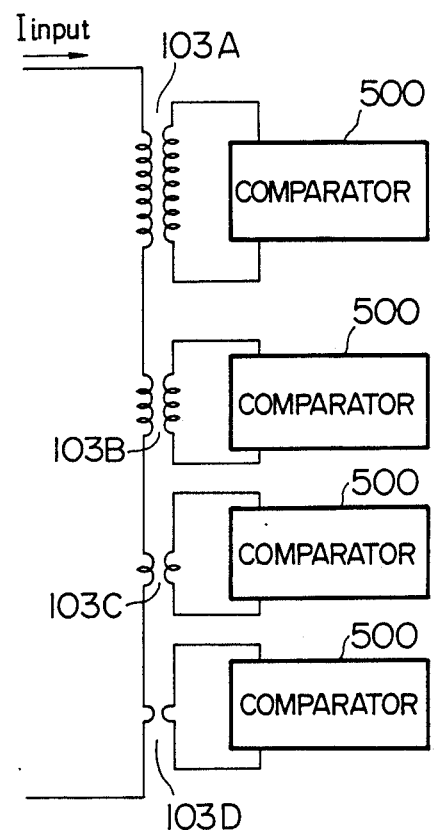

FIG. 11 is an another embodiment of an analog to digital converter which is useful for the embodiments of FIGS. 1 and 3. In this embodiment, the input signal current $I_{input}$ is inputted through an input transformer. In the embodiment of FIG. 11, an input transformer having inductive couplings 103A, 103B, 103C and 103D is provided. The coupling coefficients of successive inductive couplings are related by a factor of 2. The second windings of the input transformer are connected to the respective comparators 500 which have same template each other. Therefore, it is obvious that this construction operates in the same way as in the analog to digital comparator of FIG. 9.

As described above, according to this invention, sampling is carried out on the rising edges of the exciting current. Therefore, there is provided an analog to digital convertor with a wide margin for power supply variance and insensitive to overshooting of a waveform of the power supply. In order to enable an analog to digital converter to operate at a high speed, high frequency alternating current power supply is needed. The above described improvements of this invention are necessary to operate the circuit at a high speed. Therefore, this invention provides important means to realize a high speed analog to digital converter.

While there have been described what are believed to be the preferred embodiments of the present invention, those skilled in the art will recognize that other and further modifications may be made thereto without departing from the spirit of the invention, and it is intended to claim all such changes and modifications as fall within the true scope of the invention.

What is claimed is:

1. A superconducting analog to digital converter comprising a plurality of comparators each of which includes:
    a quantum flux parametron having a superconducting loop with a first and second Josephson devices and two exciting inductors, a first load inductor connected to the superconducting loop, and means for supplying exciting current to inductors inductively coupled with said exciting inductors and
    an rf-SQUID comprising a superconducting loop with a second load inductor and a third Josephson device, whereby input signals are supplied to the quantum flux parametron through the rf-SQUID.

2. A superconducting analog to digital converter defined in claim 1 in which the superconducting loop of said rf-SQUID includes an input inductor, the loop of said rf-SQUID is separated from the loop of said quantum flux parametron, said second inductor is inductively coupled with said quantum flux parametron whereby said input signals are supplied through said input inductor.

3. A superconducting analog to digital converter defined in claim 1 in which the loop of said rf-SQUID comprises said quantum flux parametron whereby said input signals are supplied through said second inductor.

4. A superconducting analog to digital converter defined in claim 1 in which the loop of said rf-SQUID includes an input inductor, the loop of said rf-SQUID is separated from said quantum flux parametron, the second load inductor of the rf-SQUID is inductively coupled with said quantum flux parametron and a line is connected between said input inductor and the third Josephson device whereby said input signals are directly supplied to the rf-SQUID through the line.

5. A superconducting analog to digital converter defined in claim 1 in which the loop of said rf-SQUID is formed by connecting a serial connection of said third Josephson device and an input inductor in parallel with said quantum flux parametron and a line is connected between the third Josephson device and the input inductor whereby said input signals are supplied through the line.

6. A superconducting analog to digital converter defined in claim 1 in which a fourth Josephson device is connected in parallel with the exciting inductors of said quantum flux parametron.

7. A superconducting analog to digital converter defined in claim 1 in which a resistor network for dividing current of said input signal is further provided and the divided currents are supplied to the respective comparators.

8. A superconducting analog to digital converter defined in claim 7 in which said resistor network is arranged by putting resistors in a ladder from.

9. A superconducting analog to digital converter defined in claim 7 in which the input signals are supplied to each comparators in a predetermined ratio through an input transformer which has a different coupling coefficient for each comparator.

10. A superconducting comparator comprising:
a quantum flux parametron having a superconducting loop with a first and second Josephson devices and two exciting inductors, a first load inductor connected to the superconducting loop, and means for supplying exciting current to inductors inductively coupled with said exciting inductors and
an rf-SQUID comprising a superconducting loop with a second load inductor and a third Josephson device, whereby input signals are supplied to the quantum flux parametron through the rf-SQUID.

* * * * *